United States Patent [19]

Littlebury

[11] Patent Number: 5,012,187
[45] Date of Patent: Apr. 30, 1991

[54] METHOD FOR PARALLEL TESTING OF SEMICONDUCTOR DEVICES

[75] Inventor: Hugh W. Littlebury, Chandler, Ariz.

[73] Assignee: Motorola, Inc., Schaumburg, Ill.

[21] Appl. No.: 431,344

[22] Filed: Nov. 3, 1989

[51] Int. Cl.[5] .......................... G01R 1/02; G01R 1/067
[52] U.S. Cl. ................................ 324/158 P; 324/72.5; 324/158 F
[58] Field of Search ............... 324/72.5, 158 P, 158 F; 371/21.1, 21.6

[56] References Cited

U.S. PATENT DOCUMENTS

| | | | |
|---|---|---|---|
| 3,710,251 | 1/1973 | Hagge et al. | 324/158 F |
| 3,949,295 | 4/1976 | Moorshead | 324/158 F |
| 4,574,235 | 3/1986 | Kelly et al. | 324/158 P |
| 4,636,722 | 1/1987 | Ardezzone | 324/158 F |
| 4,697,143 | 9/1987 | Lockwood et al. | 324/158 P |
| 4,727,319 | 2/1988 | Shahriary | 324/158 F |
| 4,799,009 | 1/1989 | Tada et al. | 324/158 F |
| 4,904,933 | 2/1990 | Snyder et al. | 324/158 P |
| 4,912,399 | 3/1990 | Greub et al. | 324/72.5 |
| 4,922,192 | 5/1990 | Gross et al. | 324/158 P |

OTHER PUBLICATIONS

"Very High Sensity Probing", by Bardotti et al., IEEE Internat. Test Conference, 12/1988, Paper 30.2, pp. 608–614.

"Membrane Probe Card Technology", by Leslie et al., IEEE Internat. Test Conf., 12/1988, Paper 30.1, pp. 601–607.

Primary Examiner—Kenneth Wieder
Assistant Examiner—William J. Burns
Attorney, Agent, or Firm—Joe E. Barbee; Stuart T. Langley

[57] ABSTRACT

A method of testing unpackaged integrated circuits using a tester which is capable of testing a plurality of memories in parallel is provided. A membrane test head having a plurality of probe bumps thereon is provided wherein the probe bumps are coupled to the tester by microstrip transmission lines formed on the membrane test head. The semiconductor memory has a plurality of contact pads thereon which are coupled to the probes. In this manner, a plurality of semiconductor memories can be tested in wafer form. Alternatively, individual semiconductor memory chips can be mounted on a receiver plate and tested individually or in parallel by moving the receiver plate so that the contact pads couple to the probes.

8 Claims, 2 Drawing Sheets

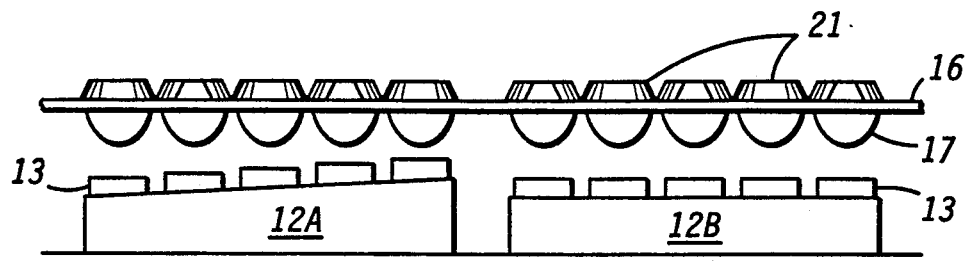
FIG. 3
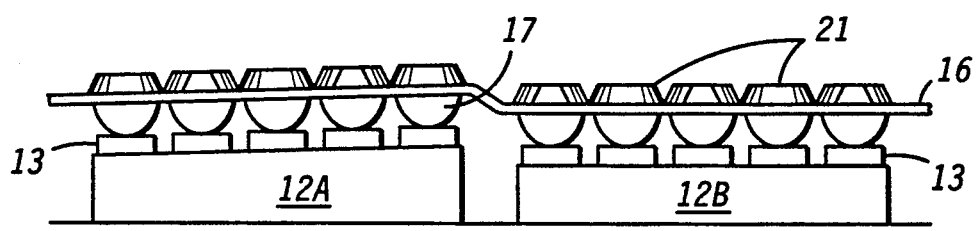
FIG. 4
FIG. 5
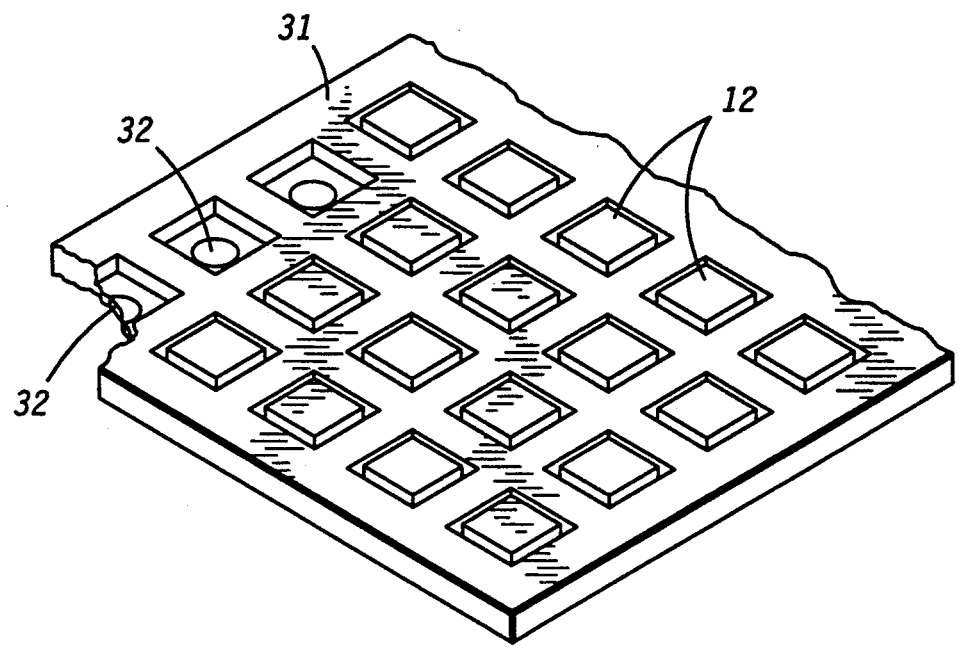

METHOD FOR PARALLEL TESTING OF SEMICONDUCTOR DEVICES

BACKGROUND OF THE INVENTION

This invention relates in general to integrated circuit testing, and more particularly to parallel testing of semiconductor memory circuits.

Semiconductor memories, also known as dynamic random access memories (DRAM) or static random access memories (SRAM), have become increasingly important components in many electronic circuits. To insure high quality, the semiconductor memories must be extensively tested before a manufacturer ships product to a customer. Recently, semiconductor memories have increased dramatically in complexity so that one to four million memory cells can be formed in a single integrated circuit. Testing such complex circuits requires a significant amount of time in the range of five to ten minutes per circuit or more.

To minimize test time, testers have been developed which can test a plurality of chips in parallel. These testers allow up to 32 memory circuits to be tested in essentially the same time as a single memory circuit. Parallel memory testers have been used to test packaged semiconductor memories for some time.

A large portion of the cost of manufacturing an integrated circuit is incurred in packaging the integrated circuit. It is desirable to package only functional integrated circuits so that packaging cost is not incurred on devices which will be thrown away. Testing semiconductor memories in chip or wafer form, before packaging, requires as much time as testing after packaging. Due to the close spacing of contact pads which are formed on the semiconductor memories, however, it has been difficult to make contact to enough integrated circuits to make parallel testing practical. When testing integrated circuits in chip or wafer form, the contact pads are usually coupled to a tester by probe needles which are mounted on a probe card or similar device. The probe needles must be aligned to the pattern of contact pads on the integrated circuit and must remain aligned through many test cycles. This alignment problem becomes more difficult as more probe needles are added to the probe card. This problem has made it virtually impossible to test more than four integrated circuits in parallel in chip or wafer form.

In addition to the alignment problem with probe needles, any non-planarity in the semiconductor wafer created difficulty in contacting all of the contact pads. As attempts were made to place more needles in contact with the wafer, this co-planarity problem becomes more acute. Although probe cards have been made with probe needles which can test up to four semiconductor memories in parallel, due to the difficulties set out above operating speed is low, maintenance cost is high and reliability is compromised.

Access time is a figure of merit for semiconductor memories. Memories must be tested at high speed and sorted into groups having similar access times. Conventional probe needle testing does not allow this high speed testing, and so the sorting operation could only be done after the devices were packaged. This made it difficult to predict availability of a memory of a particular access time group until the very end of the assembly process. It is advantageous to know the access time of a memory as early as possible, preferably when the memories are still in wafer form.

Recently, membrane probe card technology has been used to probe integrated circuit chips with closely spaced contact pads. This technology was described by B. Leslie and F. Matta in "Membrane Probe Card Technology (The Future for High Performance Wafer Test)," presented at the 1988 IEEE International Test Conference. This technology has been used to replace probe needles with probe bumps which are formed on a flexible membrane. However, since chips were still tested individually, little improvement was realized in process cycle time.

Accordingly, it is an object of the present invention to provide a method for testing integrated circuits in parallel prior to packaging.

It is another object of the present invention to provide a method of testing semiconductor memories without probe needles.

It is a further object of the present invention to provide a method of testing integrated circuits which compensates for co-planarity problems.

It is a further object of the present invention to provide a method of testing semiconductor memories with higher throughput and lower cost.

Another object of the present invention is to provide a method of testing semiconductor memories which allows high speed testing to be completed in wafer form.

It is another object of the present invention to provide a method of testing semiconductor memories which takes advantage of testers which are capable of testing a plurality of memories in parallel.

SUMMARY OF THE INVENTION

These and other objects of the present invention are achieved by testing integrated circuits using a tester which is capable of testing a plurality of semiconductor memory chips in parallel, and a membrane test head having a plurality of probes thereon. The probes are coupled to the tester and to a plurality of contact pads which are formed on the semiconductor memory chips. In this manner, a plurality of semiconductor memories can be tested in wafer form. Alternatively, individual semiconductor memory chips can be mounted on a receiver plate and tested individually or in parallel by moving the receiver plate so that the contact pads couple to the probes.

BRIEF DESCRIPTION OF DRAWINGS

FIGS. 3 and 4 illustrate the process of contacting a plurality of memory chips using the membrane probe of FIG. 2; and FIG. 5 illustrates a receiver plate of the present invention.

DETAILED DESCRIPTION OF DRAWINGS

Figure 1:
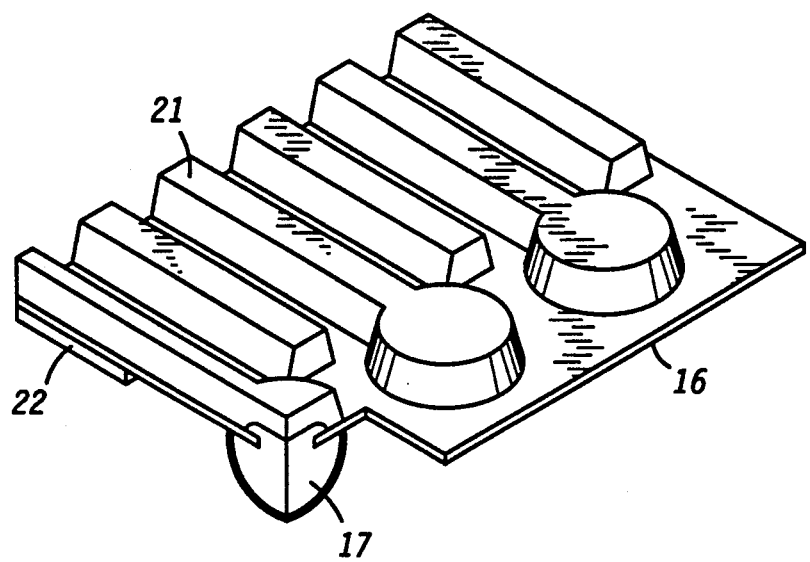
FIG. 1 illustrates a portion of a prior art membrane probe card.

FIG. 1 illustrates a perspective view of a portion of a prior art membrane probe used in the present invention. Structural details of the membrane probe can be found in "Membrane Probe Card Technology (The Future for High Performance Wafer Test)" by Brian Leslie and Farid Matta, 1988 *International Test Conference*, pp. 601–607. Membrane 16 comprises a flexible printed circuit board material. On a bottom surface of membrane 16, a plurality of probe bumps 17 are formed which extend several mils below the surface of membrane 16. A conductive ground plane 22 is also formed on the bottom surface of membrane 16. On a top surface of membrane 16, microstrip transmission lines 21 are formed to couple probe bump 17 to a tester (not shown). Contact is made to microstrip transmission lines 21 at an edge of membrane 16, as is commonly done with printed circuit boards. Conventional printed circuit board techniques are used to form probe bumps 17, microstrip transmission lines 21, and conductive ground plane 22. Optionally, ground lines 15 may be formed in between microstrip transmission lines 21 to improve signal integrity.

Figure 2:
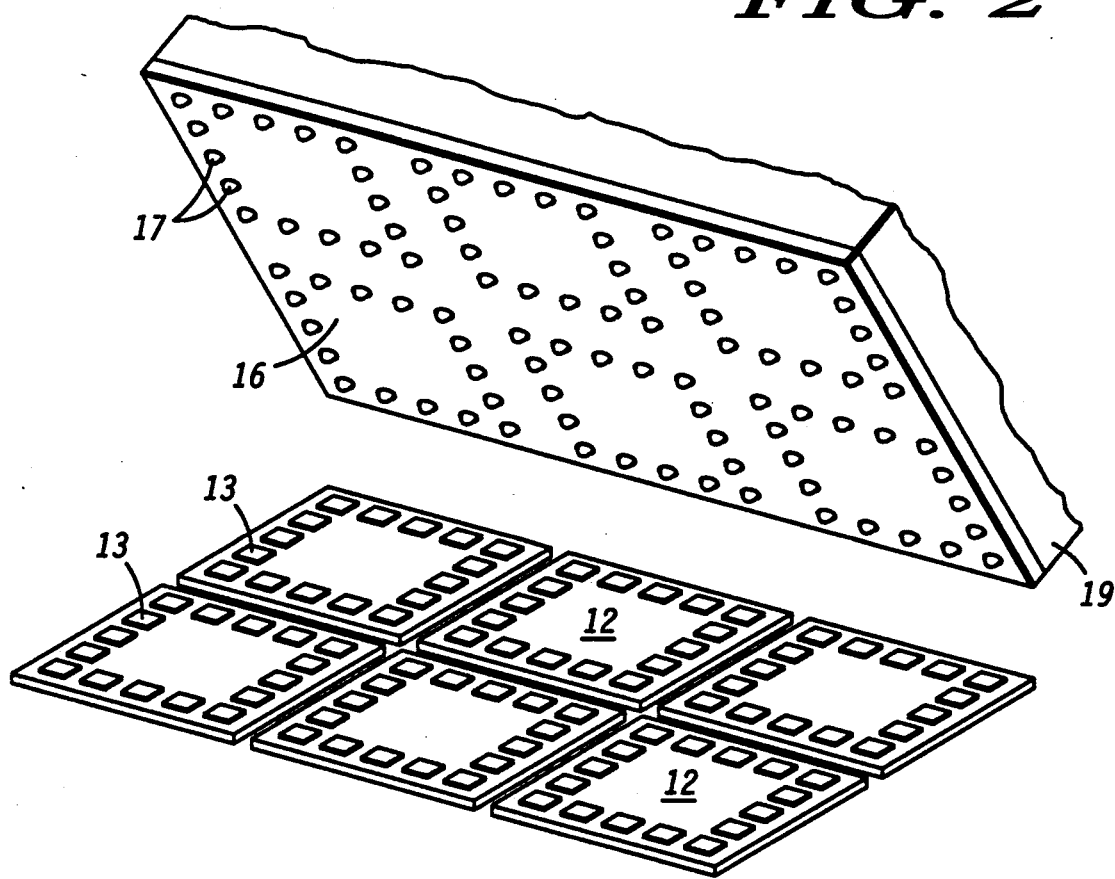
FIG. 2 illustrates the alignment of a membrane probe of the present invention to a plurality of memory chips.

FIG. 2 illustrates a typical mounting arrangement for membrane 16. Membrane 16 is mounted to support 19 so that bumps 17 extend away from support 19. Support 19 provides mechanical support for membrane 16 and conveniently allows pressure to be applied to membrane 16 from the top side. Pressure may be applied by a weight, air pressure, water pressure, or the like. Membrane 16 will stretch and distend like a balloon. This pressure bends membrane 16 and forces probe bumps 17 to extend away from support 19. It should be understood that support 19 may be any shape necessary to adapt to other equipment used in testing, such as probe machines. Integrated circuit chips 12 are placed in proximity with membrane 16 and probe bumps 17 are aligned to contact pads 13 formed on integrated circuit chips 12. Preferably, integrated circuit chips 12 are semiconductor memory chips, but any circuit which is compatible with parallel testing may be used. One probe bump 17 is provided for each contact pad 13 on memory chips 12 to be tested. Memory chips 12 and/or the membrane probe are moved toward each other so as to couple probe bumps 17 to contact pads 13. It will be understood that only six integrated circuit chips 12 are shown for ease of illustration; however, many more chips 12 are intended to be tested in parallel.

FIGS. 3 and 4 illustrate the contact process as probe bump 17 and contact pads 13 are moved toward each other. Memory chip 12a illustrated in FIG. 3 suffers from a severe co-planarity problem in that contact pads 13 are vertically misaligned from each other. Additionally, contact pads 13 on memory chip 12b are vertically misaligned from those on chip 12a. Co-planarity problems within a chip, as well as from chip to chip are common. Usually, each memory chip 12 may have 10-30 contact pads 13. FIG. 4 illustrates how flexible membrane 16 conforms to the irregularities presented by memory chips 12a and 12b. Membrane 16 bends to conform to the irregularity so that a constant pressure is applied to each of the contact pads 13 on chips 12a and 12b by probe bumps 17. It has been found that by using a membrane probe, hundreds of connections can be made over a large area. In particular, connections can be made to multiple chips simultaneously, whether or not the chips are in wafer form or chip form. In this manner, reliable non-damaging contact is made to contact pads 13.

Improved contact may be obtained if probe bumps 17 are irregularly shaped instead of round. It is believed that the irregular shape will encourage a scrubbing motion as probe bumps 17 rub against contact pads 13. The scrubbing motion will break through any metal oxide which may be on the surfaces of probe bumps 17 or contact pads 13. Probe bumps 17 can be etched to have a rounded trapezoidal shape which would accomplish this scrubbing motion.

Microstrip transmission lines 21 on the upper surface of membrane 16 allow high speed signals to be transmitted to and from memory chips 12 with minimal signal distortion. This feature allows high speed testing of memory chips 12 so that the chips can be sorted for access time before assembly. This allows manufacturers to build only product which is in demand, and to predict lead times on product with improved accuracy.

The plurality of chips 12 shown in FIG. 2 may be either in wafer form or mounted on receiving plate 31 as illustrated in FIG. 5. In a preferred embodiment, the present invention is practiced by dicing memory chips 12 from a semiconductor wafer on which they are formed. Sawing, scribing, or the like may be used to separate semiconductor chips 12 from the wafer on which they are formed. Conventional pick and place equipment is then used to remove the diced chips and accurately place them on receiver plate 31 illustrated in FIG. 5. Receiver plate 31 has a plurality of wells machined or etched into a top surface, each well having a vacuum port 32 formed therein. The wells are large enough so that chips 12 can easily be placed in and removed from the wells, but not so large as to allow significant movement by chips 12 once they are placed in the well. Three wells are shown empty in FIG. 5 to illustrate vacuum ports 32. Preferably, about ten percent of the thickness of memory chip 12, or about 1-2 mils, extends above the well. Vacuum ports 32 are sized to hold memory chips 12 in place after they have been placed on receiver plate 31. Receiver plate 31 may be made of ceramic, metal, or the like. In a preferred embodiment, receiver plate 31 can hold up to thirty-two memory chips.

Membrane probe 16 as shown in FIG. 2 is then placed in contact with contact pads on semiconductor chips 12 as described hereinbefore. Memory chips 12 are then tested in parallel, greatly increasing the throughput of the probe test operation. Once testing is complete, receiver plate 31 is pulled away from the membrane probe and pick and place equipment is once again used to remove die which have passed the test from receiver plate 31. At this point, memory chips 12 can be mounted directly on lead frames for further packaging, or stored for future assembly.

It is useful to create a map of memory chips 12 which have passed testing so that good die can be sorted from bad die, or so that die having similar access times can be grouped together. This map can be a physical map, recorded on paper, or a computer map. Alternatively, memory chips 12 are inked after testing to indicate test results. Mapping or inking is particularly necessary when testing in wafer form, but may be useful when using receiver plate 31 also.

By now, it should be appreciated that a method for testing semiconductor memories in chip or wafer form having improved throughput is provided. By testing memory chips in parallel, equipment utilization is improved and assembly yields are improved by assembling only chips which pass testing. By using membrane probe technology to test multiple die in parallel, manufacturing and assembly costs are greatly reduced.

I claim:

1. A method of testing a plurality of semiconductor memory chips which are separated from a semiconductor wafer in which they were formed in parallel comprising the steps of: providing a tester which is capable of parallel testing memory devices; providing a flexible membrane having a plurality of probe bumps which are coupled to the tester; placing the individual memory chips on a receiver plate, wherein the receiver plate has a plurality of vacuum ports for holding the memory chips; testing access time of the plurality of memory chips in parallel; and storing information relating to location of memory chips which pass the test.

2. The method of claim 1 further comprising the steps of: removing the chips which pass the test from the receiver plate and mounting them on a leadframe.

3. The method of claim 1 wherein each of the probe bumps on the flexible membrane is coupled to the tester by a transmission line formed on the flexible membrane.

4. A method for testing a plurality of integrated circuits which are separated from a semiconductor wafer in which they were formed, wherein each of the integrated circuits has a plurality of contact pads for electrical connection to the integrated circuit, the method comprising the steps of: providing a receiver plate having a vacuum port for each of the plurality of integrated circuits, wherein the vacuum port is sized to hold one of the integrated circuits; providing a well in the receiver plate surrounding each of the vacuum ports, wherein the well is sized to prevent substantial movement of the integrated circuit; providing a membrane probe having a plurality of probe bumps formed on one side of a flexible membrane, wherein the probe bumps are electrically coupled to a tester; placing each of the integrated circuits individually on the receiver plate covering one vacuum port; applying a vacuum to each of the vacuum ports; moving the receiver plate and/or the membrane probe so that the probe bumps couple to each of the plurality of contact pads of the plurality of integrated circuits; and testing the plurality of integrated circuits.

5. The method of claim 4 wherein the plurality of integrated circuits comprise semiconductor memory circuits.

6. The method of claim 4 wherein the tester is capable of testing a plurality of memory circuits in parallel.

7. The method of claim 4 wherein the membrane probe further comprises a ground plane formed on the same side of the flexible membrane as the probe bumps.

8. The method of claim 7 wherein the probe bumps are coupled to the tester by stripline conductors formed on a side of the flexible membrane opposite the probe bumps.

* * * * *